(12) United States Patent
Li et al.

(10) Patent No.: US 9,998,141 B2
(45) Date of Patent: Jun. 12, 2018

(54) METHOD AND SYSTEM FOR TRANSMITTING DATA

(71) Applicants: Chi-Bin Li, Taipei (TW); Ching-Ming Lee, Taipei (TW)

(72) Inventors: Chi-Bin Li, Taipei (TW); Ching-Ming Lee, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 621 days.

(21) Appl. No.: 14/583,788

(22) Filed: Dec. 29, 2014

(65) Prior Publication Data

US 2016/0165012 A1 Jun. 9, 2016

(30) Foreign Application Priority Data

Dec. 3, 2014 (TW) .............................. 103141967 A

(51) Int. Cl.
*G06F 15/16* (2006.01)
*H03M 7/30* (2006.01)
*H04N 1/32* (2006.01)
*H04L 29/08* (2006.01)

(52) U.S. Cl.
CPC ....... *H03M 7/3064* (2013.01); *H03M 7/3091* (2013.01); *H04N 1/32277* (2013.01); *H04L 67/04* (2013.01)

(58) Field of Classification Search
CPC ........ H04L 69/04; H03M 7/30; H03M 7/3064
USPC ....................................................... 709/247
See application file for complete search history.

(56) References Cited

U.S. PATENT DOCUMENTS

| | | | | |
|---|---|---|---|---|
| 8,768,895 B2 * | 7/2014 | Patterson | .......... | G06F 17/30312 707/690 |
| 8,849,772 B1 * | 9/2014 | Huang | ................ | G06F 11/1453 707/640 |
| 8,929,402 B1 * | 1/2015 | Hughes | .................. | H04L 69/04 370/477 |
| 9,396,071 B1 * | 7/2016 | Akanda | ............... | G06F 9/45533 |
| 2014/0358871 A1 * | 12/2014 | Cideciyan | ......... | G06F 17/30156 707/692 |
| 2015/0032978 A1 * | 1/2015 | Bashyam | .......... | G06F 17/30159 711/162 |
| 2015/0363282 A1 * | 12/2015 | Rangasamy | ........ | G06F 11/2033 714/4.12 |

* cited by examiner

*Primary Examiner* — Aftab N. Khan
(74) *Attorney, Agent, or Firm* — JCIPRNET

(57) ABSTRACT

A method and a system for transmitting data are provided. In a source apparatus, original data is divided into a plurality of source segments, a similarity calculation is performed for each of the source segments to obtain a similarity set, and the similarity set is transmitted to a target apparatus. In the target apparatus, whether a target segment corresponding to the source segment exists in the target apparatus is determined according to the similarity set to obtain a comparison result, and the comparison result is transmitted to the source apparatus. In the source apparatus, after the original data is dehydrated according to the comparison result to obtain dehydration data, the dehydration data is transmitted to the target apparatus. In the target apparatus, the dehydration data is rehydrated to the original data.

12 Claims, 9 Drawing Sheets

METHOD AND SYSTEM FOR TRANSMITTING DATA

CROSS-REFERENCE TO RELATED APPLICATION

This application claims the priority benefit of Taiwan application serial no. 103141967, filed on Dec. 3, 2014. The entirety of the above-mentioned patent application is hereby incorporated by reference herein and made a part of this specification.

BACKGROUND OF THE INVENTION

Field of the Invention

The disclosure relates to a remote data transmission mechanism, and more particularly, relates to a method and a system for transmitting data, which are capable of reducing a data transmission quantity on a network.

Description of Related Art

With advancements of information technology in recent years, businesses are increasingly relying on electronic products. Especially, as electronicization is vigorously promoted by enterprise users, the electronic products are widely used to apply various functions and record various data. A file transmission between electronic devices is a common operation for users to upload files of the local electronic device to a remote electronic device via a network. However, as data quantity continuously becoming larger, it is an important issue as how to speed up a data transmission between a local device and a remote device.

SUMMARY OF THE INVENTION

The disclosure is directed to a method and a system for transmitting data, which are capable of reducing the data quantity of the data transmission.

A data transmission method of the disclosure includes the following steps. In a source apparatus, original data is divided into a plurality of source segments, a similarity calculation is performed for each of the source segments to obtain a similarity set, and the similarity set is transmitted to a target apparatus. The similarity set includes a similarity value of each of the source segments. In the target apparatus, whether a target segment corresponding to any one of the source segments exists in the target apparatus is determined according to the similarity set to obtain a comparison result, and the comparison result is transmitted to the source apparatus. In the source apparatus, after the original data is dehydrated according to the comparison result to obtain dehydration data, the dehydration data is transmitted to the target apparatus. In the target apparatus, the dehydration data is rehydrated to the original data.

In an embodiment of the disclosure, the step of obtaining the comparison result in the target apparatus includes the following. When determining that the target segment corresponding to any one of the source segments does not exist in the target apparatus, the similarity value of the source segment where the corresponding target segment does not exist and a corresponding null value are recorded into the comparison result. When determining that the target segment corresponding to the source segment exists in the target apparatus, the similarity value of the source segment where the corresponding target segment exists and the similarity value of corresponding target segment are recorded into the comparison result. A hash value of each of a plurality of target blocks included in the target segment corresponding to the source segment is retrieved. The hash values are recorded into the comparison result.

In an embodiment of the disclosure, the step of dehydrating the original data according to the comparison result includes: applying a delta compression algorithm for each of the source segments not having the corresponding target segment in the target apparatus according to the comparison result; applying a deduplication algorithm for a plurality of source blocks included in each of the source segments where the delta compression algorithm is not applied; and compressing the data where the delta compression algorithm and the deduplication algorithm are not applied, so as to obtain the dehydration data.

In an embodiment of the disclosure, the step of applying the delta compression algorithm includes: sequentially retrieving one of the source segments to serve as a current segment, and determining whether the corresponding target segment is provided in the target apparatus according to the comparison result; if no, retrieving a plurality of previous segments in front of the current segment and comparing the previous segments with the current segment, so as to retrieve a $N^{th}$ source segment having a highest similarity degree with respect to the current segment from among the previous segments in order to apply the delta compression algorithm for the current segment and the $N^{th}$ source segment.

In an embodiment of the disclosure, the step of applying the deduplication algorithm includes: in the source segments where the delta compression algorithm is not applied, sequentially retrieving the source blocks included in one of the source segments; determining whether a source block table in the source apparatus and the comparison result have the same hush value, and marking a target index on the same hash value when the same hash value is present; and determining whether the hash value of each of the source blocks is repeated according to the source block table, and marking an internal index on the repeated hash value.

In an embodiment of the disclosure, in the source apparatus, after the step of dividing the original data into the source segments, the data transmission method further includes: dividing each of the source segments into the source blocks; and performing a hash value calculation for each of the source blocks to obtain the hash value of each of the source blocks, and recording the hash values into the source block table.

In an embodiment of the disclosure, in the target apparatus, the step of rehydrating the dehydration data to the original data includes: decompressing the dehydration data; rehydrating the source block deleted by the deduplication algorithm in the dehydration data; and rehydrating the source segments dehydrated by the delta compression algorithm.

In an embodiment of the disclosure, in the source apparatus, the similarity set and an ex-received similarity set are transmitted to the target apparatus. The ex-received similarity set includes the similarity value(s) of the target segment recorded in the comparison result previously received from the target apparatus. In the target apparatus, when the target segment corresponding to any one of the source segments exists in the target apparatus, if the similarity value of the target segment is included in the received similarity value, the hash value of each of the target blocks included in the target segment of the target apparatus is not recorded into the comparison result currently intended to be transmitted to the source apparatus.

A data transmission system of the disclosure includes a source apparatus and a target apparatus. The source apparatus includes a first communication unit and a first processing unit. The target apparatus includes a second communication unit and a second processing unit. Herein, the target apparatus and the source apparatus are communicated through the second communication unit and the first communication unit. The first processing unit divides original data into a plurality of source segments, performs a similarity calculation for each of the source segments to obtain a similarity set, and transmits the similarity set to the target apparatus. The similarity set includes a similarity value of each of the source segments. After the similarity set is received by the target apparatus from the source apparatus, the second processing unit determines whether a target segment corresponding to any one of the source segments exists in the target apparatus according to the similarity set to obtain a comparison result, and transmits the comparison result to the source apparatus. After the comparison result is received by the source apparatus from the target apparatus, the first processing unit dehydrates the original data according to the comparison result to obtain dehydration data, and transmits the dehydration data to the target apparatus. After the dehydration data is received by the target apparatus from the source apparatus, the second processing unit rehydrates the dehydration data to the original data.

Based on the above, by adopting a collaboration of the source apparatus and the target apparatus, the repeated data may be deleted before transmission, so as to achieve the purpose of reducing the data transmission quantity on the network and saving the data storage amount.

To make the above features and advantages of the disclosure more comprehensible, several embodiments accompanied with drawings are described in detail as follows.

DESCRIPTION OF THE EMBODIMENTS

Figure 1:
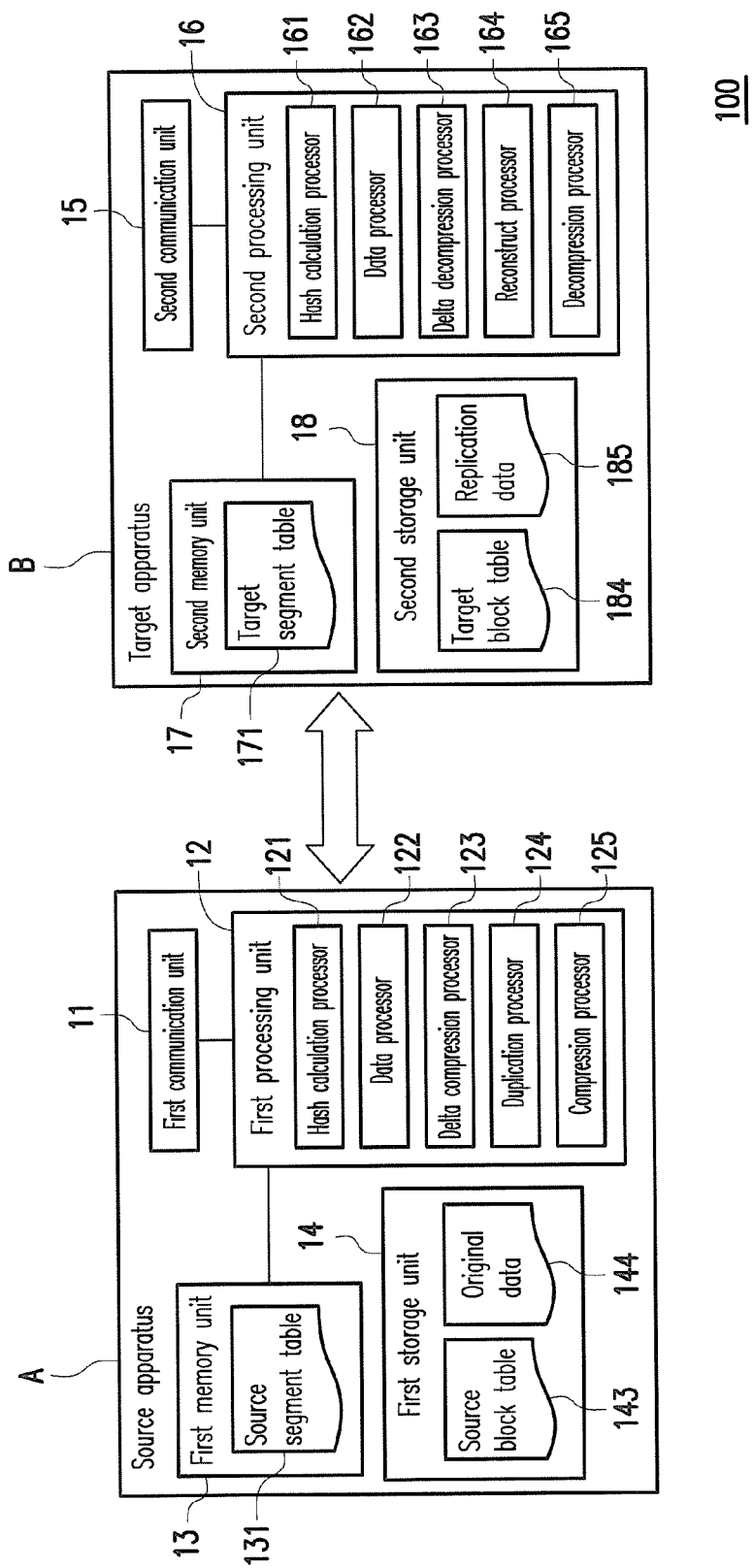
FIG. 1 is a block diagram illustrating a data transmission system according to an embodiment of the disclosure.

FIG. 1 is a block diagram illustrating a data transmission system according to an embodiment of the disclosure. Referring to FIG. 1, a data transmission system 100 includes a source apparatus A and a target apparatus B. The source apparatus A includes a first communication unit 11, a first processing unit 12, a first memory unit 13 and a first storage unit 14. The first processing unit 12 is coupled to the first communication unit 11, the first memory unit 13 and the first storage unit 14. The target apparatus B includes a second communication unit 15, a second processing unit 16, a second memory unit 17 and a second storage unit 18. The second processing unit 16 is coupled to the second communication unit 15, the second memory unit 17 and the second storage unit 18. The source apparatus A and the target apparatus B are communicated through the first communication unit 11 and the second communication unit 15.

For example, the source apparatus A is an electronic device with computing capability, such as a server, a back-end storage device and the like. The target apparatus B is, for example, an electronic device for backup. In other embodiments, it is also possible that a relation between amounts of the source apparatus A and the target apparatus B is a plurality of source apparatuses A for one target apparatus B, or a plurality of source apparatuses A for a plurality of target apparatuses B.

The first memory unit 13 and the second memory unit 17 are, for example, a volatile memory such as a random access memory (RAM) and the like. The first storage unit 14 and the second storage unit 18 are, for example, a non-volatile storage element such as a magnetic disk and the like. The first memory unit 13 is configured to store a source segment table 131, and the first storage unit 14 is configured to store a source block table 143 and original data 144. The second memory unit 17 is configured to store a target segment table 171, and the second storage unit 18 is configured to store a target block table 184 and replication data 185.

The first processing unit 12 and the second processing unit 16 are, for example, a central processing unit (CPU), a programmable microprocessor, or an embedded control chip and the like. The first communication unit 11 and the second communication unit 15 are, for example, a wired network interface card or a wireless network interface card, and configured to allow the source apparatus A to be communicated with the target apparatus B via a network.

In the source apparatus A, the first processing unit 12 includes a hash calculation processor 121, a data processor 122, a delta compression processor 123, a duplication processor 124 and a compression processor 125. In the target apparatus B, the second processing unit 16 includes a hash calculation processor 161, a data processor 162, a delta decompression processor 163, a reconstruct processor 164 and a decompression processor 165. A data transmission method for the source apparatus A and the target apparatus B may be realized by using aforesaid processors.

Figure 2:
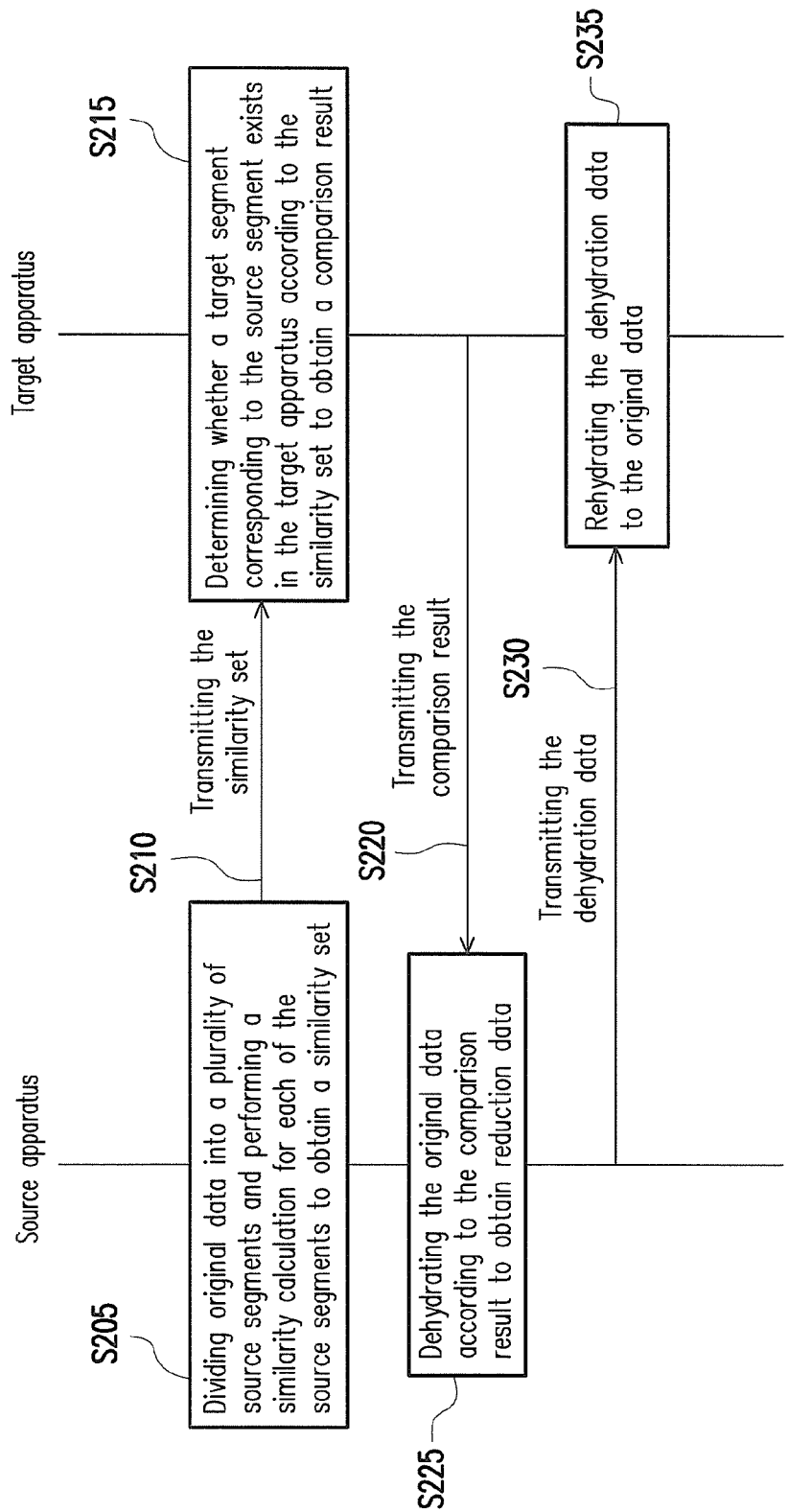
FIG. 2 is a flowchart illustrating a data transmission method according to an embodiment of the disclosure.

Detailed steps of the data transmission method are described below with reference to the data transmission system 100. FIG. 2 is a flowchart illustrating a data transmission method according to an embodiment of the disclosure. Referring to FIG. 1 and FIG. 2 together, in a source apparatus A, the first processing unit 12 divides the original data 144 into a plurality of source segments, performs a similarity calculation for each of the source segments to obtain a similarity set (step S205), and transmits the similarity set to the target apparatus B (step S210). Herein, the similarity set includes a plurality of similarity values obtained by performing the similarity calculation for each of the source segments.

After the similarity set is received by the target apparatus B from the source apparatus A, the second processing unit 16 determines whether a target segment corresponding to any one of the source segments exists in the target apparatus B according to the similarity set to obtain a comparison result (step S215), and transmits the comparison result to the source apparatus A (step S220).

After the comparison result is received by the source apparatus A from the target apparatus B, the first processing unit 12 dehydrates the original data 144 according to the comparison result to obtain dehydration data (step S225), and then transmits the dehydration data to the target apparatus B (step S230). After the dehydration data is received by the target apparatus B from the source apparatus A, the second processing unit 16 rehydrates the dehydration data to the original data (step S235).

Specifically, in step S205, the first processing unit 12 of the source apparatus A uses the data processor 122 to divide the original data 144 into a plurality of segments and divide each of the segments into a plurality of blocks. Herein, the segments divided from the original data 144 are referred to as the source segments, and the blocks divided from each of the source segments are referred to as the source blocks. The hash calculation processor 121 performs the similarity calculation for each of the source segments to record the similarity value of each of the source segments into the source segment table 131, and performs a hash value calculation for each of the source blocks to record a hash value of each of the source blocks into the source block table 143.

Figure 3:
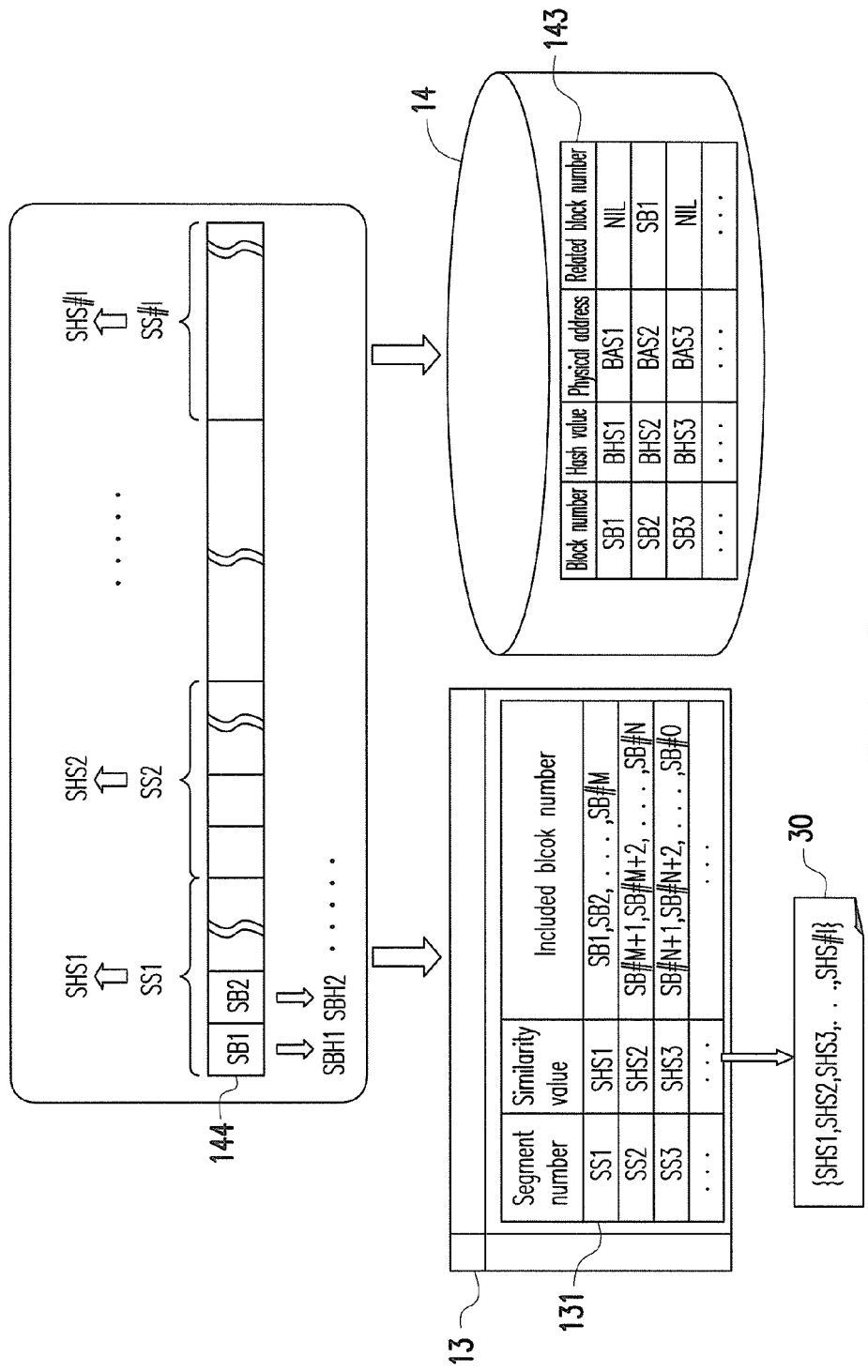
FIG. 3 is a schematic diagram of data processing in the source apparatus according to an embodiment of the disclosure.
Figure 4:
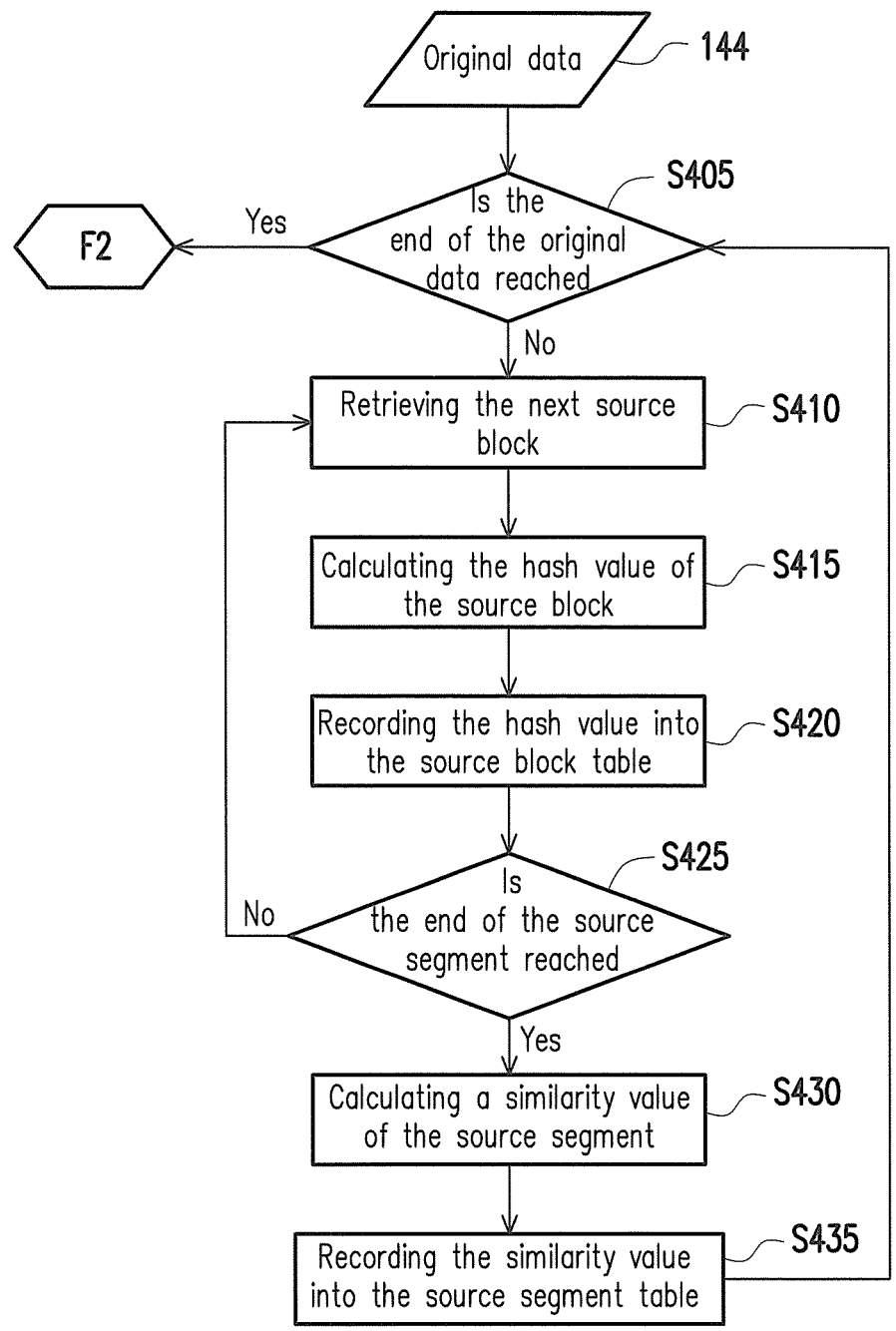
FIG. 4 is a flowchart illustrating a similarity calculation procedure according to an embodiment of the disclosure.

For instance, FIG. 3 is a schematic diagram of data processing in the source apparatus according to an embodiment of the disclosure. FIG. 4 is a flowchart illustrating a similarity calculation procedure according to an embodiment of the disclosure. The first processing unit 12 uses the data processor 122 to divide the original data 144 into a source segment SS1 to a source segment SS#I. Herein, "#I" is used to indicate a total quantity of the division. Herein, the source segment SS1 is divided into source blocks SB1 to SB#M, the source segment SS2 is divided into source blocks SB#M+1 to SB#N, and the source segment SS3 is divided into source blocks SB#N+1 to SB#O. Herein, "#M," "#N," "#O" are used to indicate total quantities of the source blocks divided from the source segments SS1, SS2 and SS3 respectively. The rest may be deduced by analogy.

The similarity calculation procedure is described below with reference to FIG. 1 to FIG. 4. In step S405, the hash calculation processor 121 determines whether a current stage reaches the end of the original data 144. If yes, the procedure proceeds to a next processing procedure F2 (referring to descriptions for FIG. 6). If no, in step S410, the hash calculation processor 121 retrieves the next source block. That is, the first source block SB1 is retrieved when step S410 is applied for the first time, and the next source block SB2 is retrieved later when step S410 is applied again, and the rest may be deduced by analogy.

Thereafter, in step S415, the hash calculation processor 121 calculates the hash value of the retrieved source block. For example, the hash calculation processor 121 may perform the hash value calculation by using the Secure Hash Algorithm (SHA), the Message-Digest Algorithm 5 (MD5), the Cyclic Redundancy Check (CRC) or the like, so as to obtain the hash value of the source block.

Then, in step S420, the hash calculation processor 121 records the obtained hash value into the source block table 143. Further, in step S425, the hash calculation processor 121 determines whether the current stage reaches the end of one of the source segments. If no, the procedure returns back to step S410, in which the next source block is retrieved in order to calculate the hash value thereof.

If yes, in step S430, the hash calculation processor 121 calculates a similarity value based on the hash values of the source blocks included in this source segment. Herein, the similarity value of the source segment includes a plurality of representative hash values. For example, the hash calculation processor 121 may select the representative hash values from among the hash values of all the source blocks to serve as the similarity value by using the K-means algorithm, the MinHash algorithm, the SimHash algorithm, the Locality Sensitive Hashing (LSH) algorithm or the like. In FIG. 3, the similarity value corresponding to the source segment SS1 is SHS1, the similarity value corresponding to the source segment SS2 is SHS2, and by analogy, the similarity value corresponding to the source segment SS#I is SHS#I.

Thereafter, in step S435, the hash calculation processor 121 records the obtained similarity value into the source segment table 131. Accordingly, each of the source blocks has one hash value, and each of the source segments has one similarity value (which includes the representative hash values).

In addition, after the hash value of each of the source blocks is obtained, a block number, a corresponding hash value, a physical address and a related block number of each of the source blocks may also be recorded into the source block table 143 of the first storage unit 14 through the data processor 122. Take the source block SB2 for example, if a hash value BHS2 of the source block SB2 is identical to a hash value BHS1 of the source block SB1, the source block SB2 is related to the source block SB1. As such, the block number of the source block SB1 is recorded as the related block number corresponding to the source block SB2.

After the similarity calculation procedure is completed, the data processor 122 uses the similarity value of each of the source segment as a similarity set 30, and transmits the similarity set 30 to the target apparatus B through the first communication unit 11 in step S210.

In step S215, the data processor 162 of the target apparatus B searches the target segment table 171 in order to determine a similarity degree of the similarity value of the similarity set 30 and a similarity value recorded in the target segment table 171. Accordingly, the data processor 162 may determine whether the target segment corresponding to the source segment exists in the target apparatus B. That is, when the similarity degree of the similarity value of the target segment table 171 and the similarity value included in the similarity set 30 is high, it indicates that the target segment corresponding to the source segment exists in the target apparatus B.

Specifically, in the target apparatus B, after the replication data 185 is received by the data processor 162, as similar to step S205, the data processor 162 also divides the replication data 185 to obtain a plurality of segments and divides each of the segments into a plurality of blocks. Herein, the segments divided from the replication data 185 are referred to as the target segments, and the blocks divided from each of the target segments are referred to as the target blocks. The hash calculation processor 161 performs a similarity calculation for each of the target segments to record the similarity value of each of the target segments into the target segment table 171, and performs a hash value calculation for each of the target blocks to record a hash value of each of the target blocks into the target block table 184. Herein, the algorithms used by the source apparatus A and the target apparatus B for applying the similarity calculation are the same, and sizes of the segments divided by the two apparatuses are also the same except the amounts of the segment may not necessarily be the same.

Figure 5:
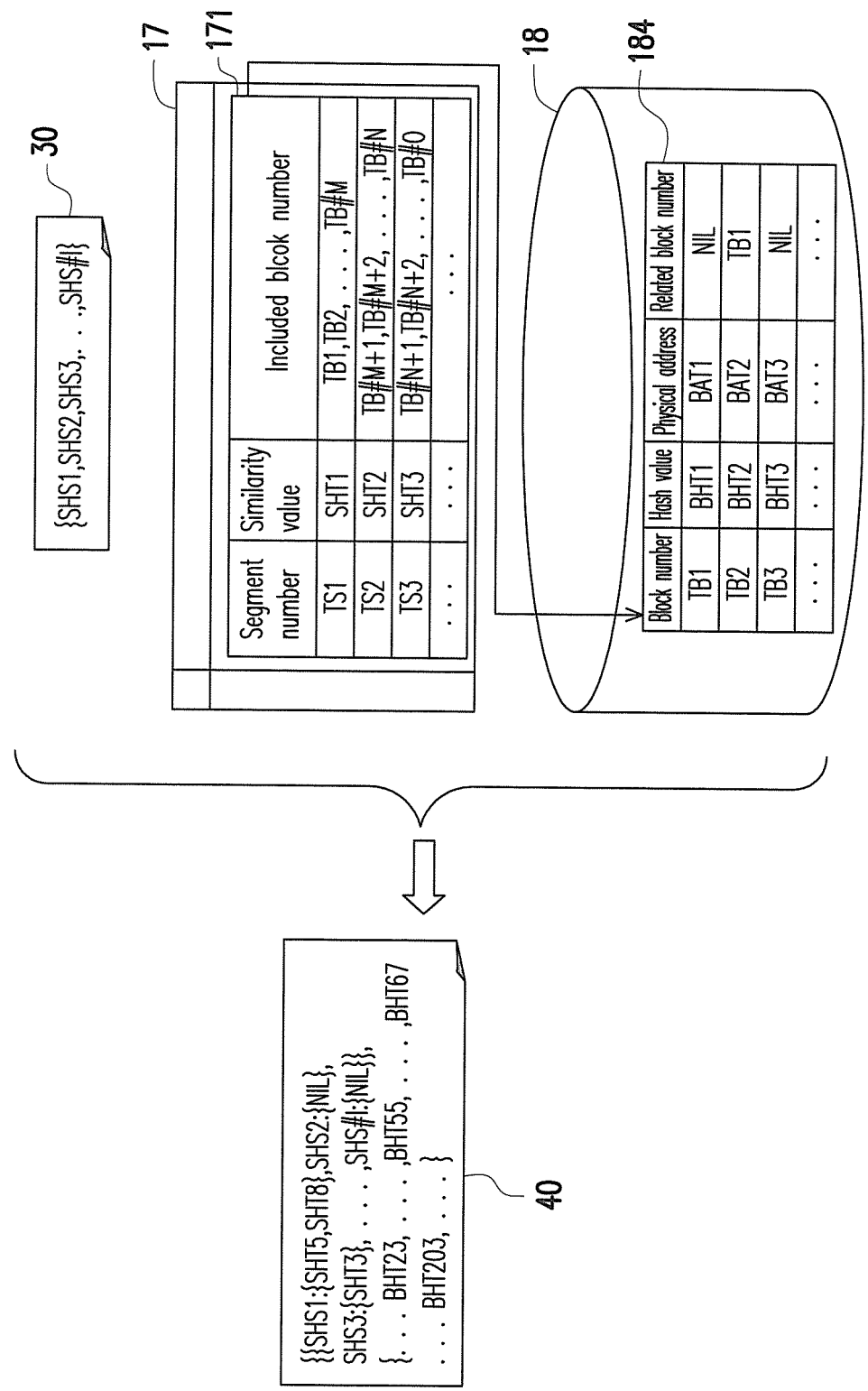
FIG. 5 is a schematic diagram of data processing in the target apparatus according to an embodiment of the disclosure.

For instance, FIG. 5 is a schematic diagram of data processing in the target apparatus according to an embodiment of the disclosure. Referring to FIG. 5, the data processor 162 divides the replication data 185 into a target segment TS1 to a source segment TS#I. Herein, "A" is used to indicate a total quantity of the division. The target segment TS1 is divided into target blocks TB1 to TB#M, the target segment TS2 is divided into target blocks TB#M+1 to TB#N, and the target segment TS3 is divided into target blocks TB#N+1 to TB#O. Herein, "#M," "#N," "#O" are used to indicate total quantities of the source blocks divided from the target segments TS1, TS2 and TS3 respectively. The rest may be deduced by analogy.

A similarity calculation procedure of the target apparatus B is similar to the similarity calculation procedure of the source apparatus A, and related description may refer to steps S405 to S435, which are not repeated hereinafter. After steps S405 to S435 are applied, the hash calculation processor 161 obtains the hash value of each of the target blocks and records the hash values into the target block table 184, and obtains the similarity value of each of the target segments and records the similarity values into the target segment table 171. Accordingly, each of the target blocks has one hash value, and each of the target segments has one similarity value (which includes the representative hash values).

In addition, after the hash value of each of the target blocks is obtained, a block number, a corresponding similarity value, a physical address and a related block number of each of the target blocks may also be recorded into the target block table 184 of the second storage unit 18 through the data processor 162.

Accordingly, after the similarity set 30 is received by the target apparatus B from the source apparatus A, the data processor 162 is used to compare the similarity degree of the similarity value of the similarity set 30 and the similarity value recorded in the target segment table 171. Accordingly, whether the target segment corresponding to the source segment exists in the target apparatus B may be determined.

Figure 6:
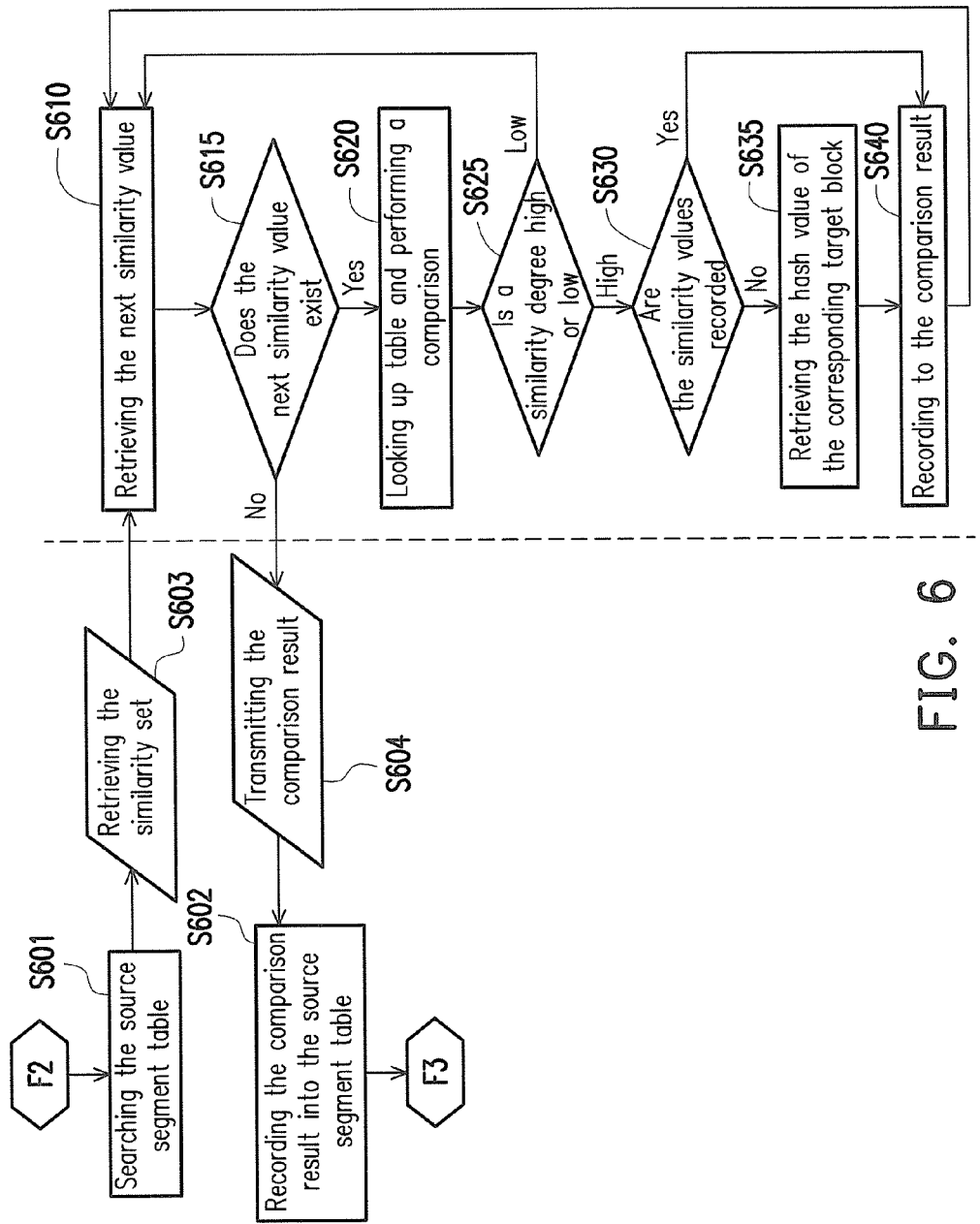
FIG. 6 is a flowchart illustrating a similarity determination procedure according to an embodiment of the disclosure.

FIG. 6 is a flowchart illustrating a similarity determination procedure according to an embodiment of the disclosure. The similarity calculation procedure is described below with reference to FIG. 1, FIG. 5 and FIG. 6. The present embodiment may be considered as a continuation of the flow in FIG. 4. That is, in FIG. 4, after the hash value calculation is performed for all of the source segments and the source blocks in the source apparatus A, the procedure proceeds to the processing procedure F2. The data processor 122 searches the source segment table 131 in step S601, retrieves the similarity set of the original data 144 and transmits the similarity set to the target apparatus B in step S603.

Next, the target apparatus B uses the data processor 162 to determine whether both apparatuses have the similar segment. In step S610, the data processor 162 retrieves the next similarity value from the similarity set. Next, in step S615, whether the next similarity value exists is determined. In other words, the first similarity value is retrieved when step S610 is applied for the first time, and the next similarity value is sequentially retrieved later when step S610 is applied again. After the last similarity value is retrieved, there is no longer the next similarity value when steps S610 and S615 are applied again. Accordingly, the result of step S615 is no, and step S604 is applied.

If the result of step S615 is yes, the procedure proceeds to step S620, in which the data processor 162 looks up table and performs a comparison. Specifically, the data processor 162 searches the target segment table 171, and compares whether the similarity degree of the similarity value of the similarity set 30 and the similarity value recorded in the target segment table 171 is high or low.

When it is determined that the similarity degree of the similarity value of the similarity set 30 (hereinafter, referred to as a first similarity value) and any one of the similarity values recorded in the target segment table 171 (hereinafter, referred to as a second similarity value) is not high (i.e., the target segment corresponding to the source segment does not exist in the target apparatus B), the procedure returns back to step S610, in which the next similarity value is retrieved from the similarity set 30. Further, the data processor 162 records the first similarity value having the low similarity degree with respect to the second similarity value and a corresponding null value into a comparison result 40. For example, "SHS2:{NIL}."

When it is determined that the similarity degree of the first similarity value and the second similarity value is high (i.e., it is determined that the target segment corresponding to the source segment exists in the target apparatus B), in step S630, whether this group of the first similarity value and the second similarity value are already recorded into the comparison result 40 is determined. If no, the procedure proceeds to step S635, in which the data processor 162 retrieves the hash value of each of the target blocks corresponding to the second similarity value with the high similarity degree.

Thereafter, in step S640, the data processor 162 records the first similarity value and the corresponding second similarity value with the high similarity degree into the comparison result 40, For example, "SHS1:{SHT5, SHT8}" and "SHS3:{SHT3}." Further, the data processor 162 records the hash value of each of the target blocks corresponding to the second similarity value with the high similarity degree into the comparison result 40. Take "SHS3: {SHT3}" for example, because the similarity degree of the first similarity value SHS3 and the second similarity value SHT3 is high, the hash values of all of the target segments TB#N+1 to TB#O corresponding to the second similarity value SHT3 are retrieved and recorded into the comparison result 40. For example, "{ . . . , BHT23, . . . BHT55, . . . , BHT67, . . . BHT203, . . . }" as shown in the comparison result 40.

If it is determined in step S630 that the second similarity value is already recorded in the comparison result 40, the procedure proceeds to step S640, in which the data processor 162 does not repeatedly record the hash values of the target blocks corresponding to the second similarity value but only records the second similarity value again. For example, assuming that the similarity degree of the first similarity value SHS4 and the second similarity value SHT3 is also high, since the hash values of all of the target segments TB#N+1 to TB#O corresponding to the second similarity value SHT3 are already recorded in the comparison result 40, only "SHS4:{SHT3}" is recorded into the comparison result 40.

Thereafter, the procedure returns back to step S610, and stops only until all of the similarity values in the similarity set are compared. Then, in step S604, the target apparatus B transmits the comparison result back to the source apparatus A. Further, in step S602, the source apparatus A records the comparison result into the source segment table 131. For example, the similarity value of the target segment corresponding to each of the source segments is recorded. Thereafter, the procedure proceeds to a next processing procedure F3 (referring to descriptions for FIG. 7).

In comparison with the flow of FIG. 2, after the comparison result is received by the source apparatus A, in step S225, a delta compression algorithm is applied for each of the source segments not having the corresponding target segment in the target apparatus B according to the comparison result, a deduplication algorithm is applied for a plurality of source blocks included in the source segments where the delta compression algorithm is not applied, and the original data 144 where the delta compression algorithm and the deduplication algorithm not applied, are compressed, so as to obtain the dehydration data.

Figure 7:
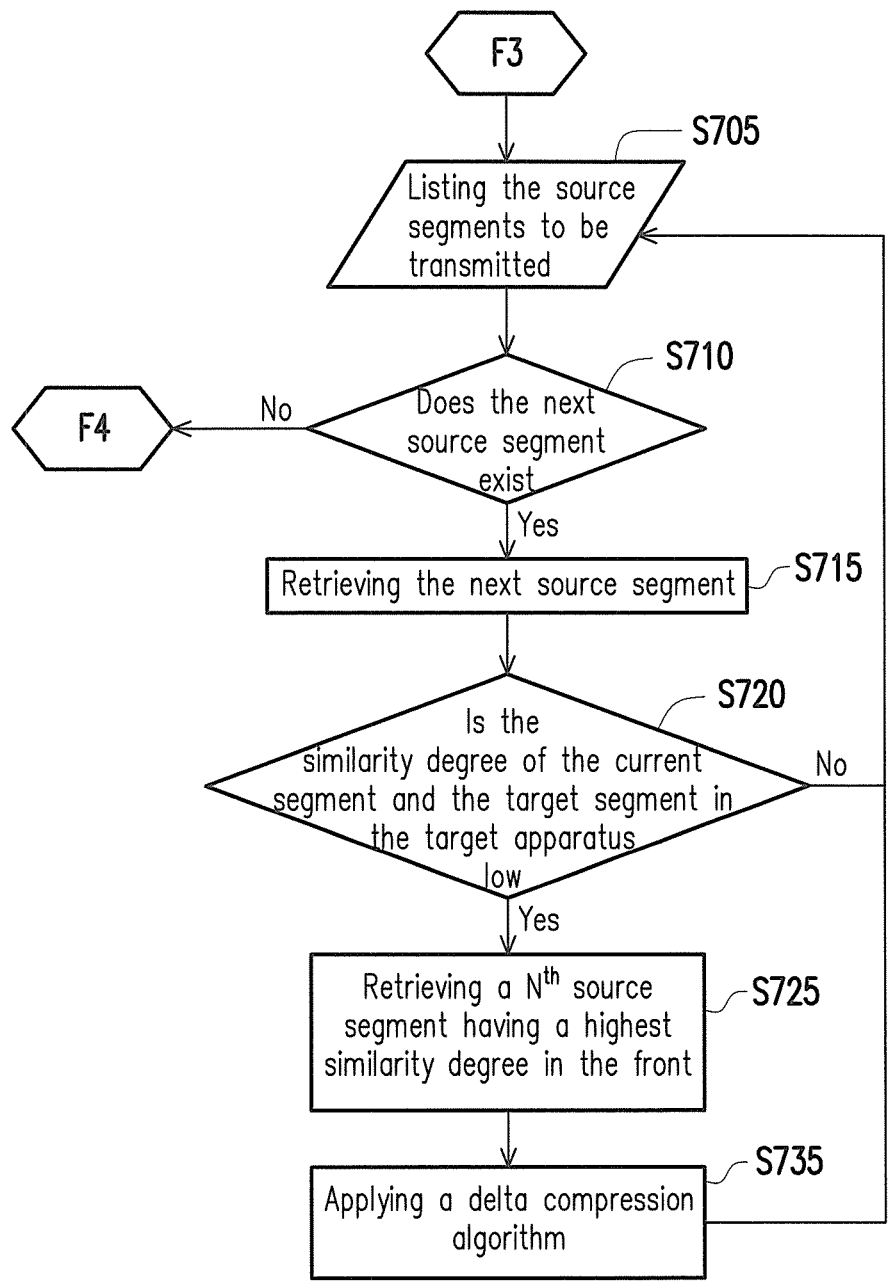
FIG. 7 is a flowchart illustrating a delta compression procedure according to an embodiment of the disclosure.

FIG. 7 is a flowchart illustrating a delta compression procedure according to an embodiment of the disclosure. In the present embodiment, the delta compression processor 123 sequentially retrieves one of the source segments to serve as a current segment, and determines whether the current segment has the corresponding target segment in the target apparatus B according to the comparison result. If no, the delta compression processor 123 retrieves a $N^{th}$ source segment having a highest similarity degree with respect to the current segment in front of the current segment, so as to apply the delta compression algorithm for the current segment and the $N^{th}$ source segment.

Specifically, in step S705, the source segments {SS1, SS2, SS3 . . . , SS#I} to be transmitted are listed. Next, in step S710, the delta compression processor 123 determines whether the next source segment exists. If yes, in step S715, the delta compression processor 123 retrieves the next source segment. If no, it indicates that the delta compression procedure is applied for all of the source segments, and thus the procedure proceeds to a next processing procedure F4 (referring to descriptions for FIG. 8).

After the source segment is retrieved, in step S720, the delta compression processor 123 determines whether the similarity degree of the retrieved source segment (the current segment) and the target segment in the target apparatus B is low according to the comparison result 40. That is, when the similarity value of the source segment in the comparison result is corresponding to one null value, it indicates that the similarity degree of this source segment and the target segment in the target apparatus B is low. When the similarity value of the source segment in the comparison result is corresponding to another similarity value, it indicates that the similarity degree of this source segment and the target segment in the target apparatus B is high. Take "{SHS1:{SHT5, SHT8}}" and "SHS3:{SHT3}" recorded in the comparison result 40 in FIG. 5 for example, it indicates that each of the similarity values SHS1 and SHS3 of the source apparatus A has the similarity value with the high similarity degree in the target apparatus B.

If the result of step S720 is no, the procedure returns back to step S705, in which the next source segment is retrieved. If the result of step S720 is yes, the procedure proceeds to step S725, in which the delta compression processor 123 retrieves the $N^{th}$ source segment having the highest similarity degree in the front. Specifically, the delta compression processor 123 retrieves a plurality of previous segments in front of the current segment and compares the previous segments with the current segment, so as to retrieve the $N^{th}$ source segment having the highest similarity degree from among the previous segments. Further, in step S735, the delta compression processor 123 applies the delta compression algorithm for the retrieved source segment (the current segment) and the $N^{th}$ source segment. For example, assuming that a fourth source segment is currently retrieved, the delta compression processor 123 may retrieve first to third source segments in front of the fourth source segment and compares the first to third source segments one by one with the fourth source segment, so as to retrieve one of said source segments (e.g., the first source segment) having the highest similarity degree with respect to the fourth source segment, and apply the delta compression algorithm for the fourth source segment and the first source segment. Herein, it should be noted that, because the first source segment does not have the previous segment, the determination of whether to apply the delta compression algorithm starts at the second source segment instead of the first source segment.

Figure 8:
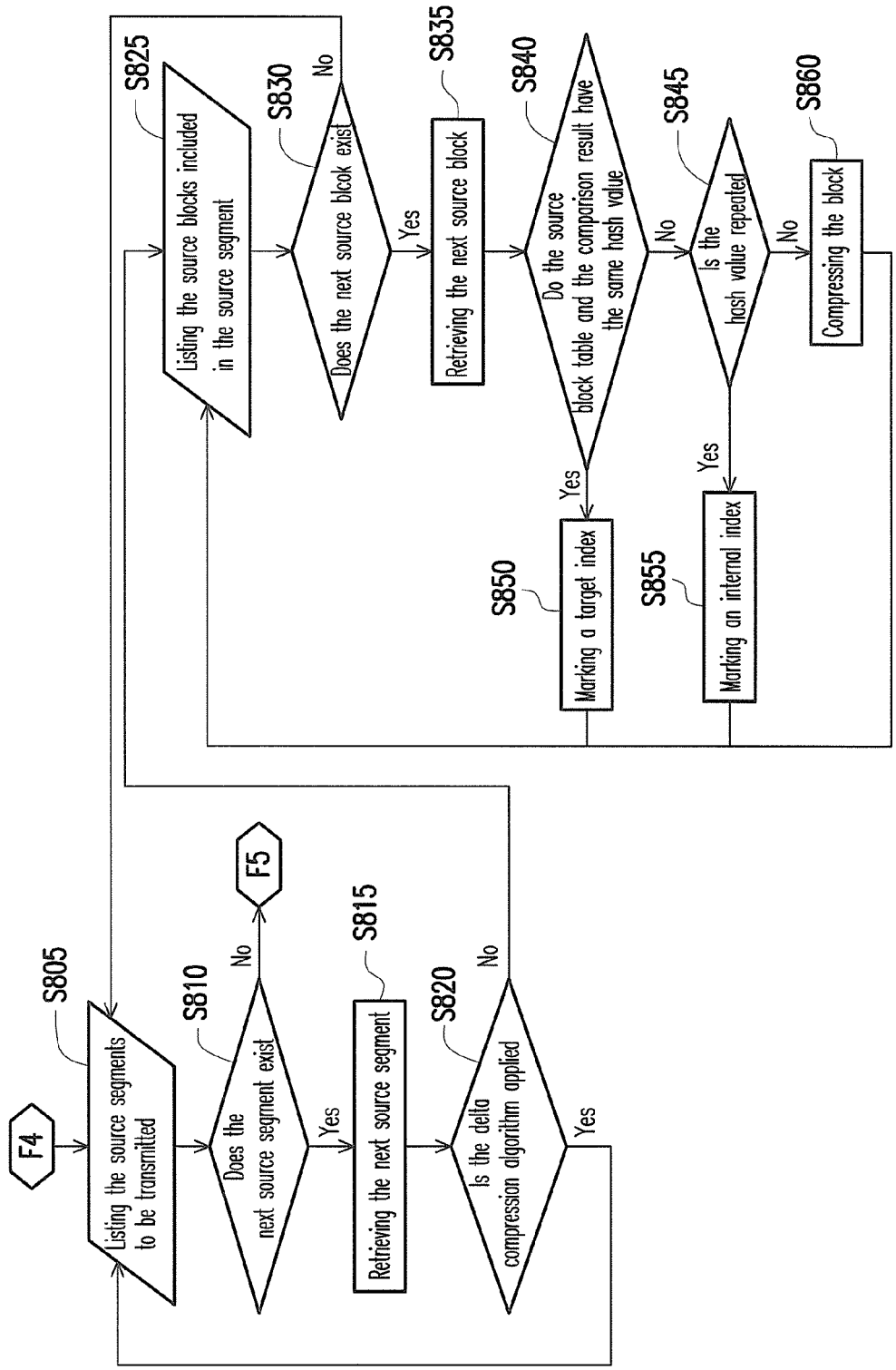
FIG. 8 is a flowchart illustrating a dehydration procedure according to an embodiment of the disclosure.

FIG. 8 is a flowchart illustrating a dehydration procedure according to an embodiment of the disclosure. In step S805, the source segments {SS1, SS2, SS3 . . . , SS#I} to be transmitted are listed. Next, in step S810, the duplication processor 124 determines whether the next source segment exists. If yes, in step S815, the duplication processor 124 retrieves the next source segment. If no, it indicates that the procedure is applied for all of the source segments, and thus the procedure proceeds to a next processing procedure F5 (referring to descriptions for FIG. 9).

After the source segment is retrieved, in step S820, the duplication processor 124 determines whether the delta compression algorithm is applied for this source segment. If yes, the procedure returns back to step S805, in which the next source segment is retrieved. If no, in step S825, the source blocks included in this source segment are listed. In step S830, the duplication processor 124 determines whether the next source block exists. If yes, in step S835, the duplication processor 124 retrieves the next source block. If no, it indicates that the procedure is applied for all of the source block, and the procedure returns back to step S805, in which the next source segment is retrieved.

After the source block is retrieved, in step S840, the duplication processor 124 determines whether the source block table 143 and the comparison result 40 have the same hash value. When the same hash value exists, in step S850, a target index is marked for the same hash value to indicate that this source block has one identical target block in the target apparatus B. If the result of step S840 is no, the procedure proceeds to step S845, in which the duplication processor 124 determines whether the hash value of each of the source blocks is repeated according to the source block table 143. If the result of step S845 is yes, in step S855, an internal index is marked on the repeated hash value to indicate that this source segment has other identical blocks in the original data 144. If the result of step S845 is no, the procedure proceeds to step S860, in which the compression processor 125 applies a data compression procedure for this source block.

Accordingly, the dehydration data may be obtained through aforesaid steps S705 to S735 and steps S805 to S860. According to the comparison result 40 transmitted from the target apparatus B, the source apparatus A may be informed of which of the source segments in the original data 144 already existed in the target apparatus B. After repeated data is deleted by the duplication processor 124, the remaining data may be compressed by the compression processor 125.

Figure 9:
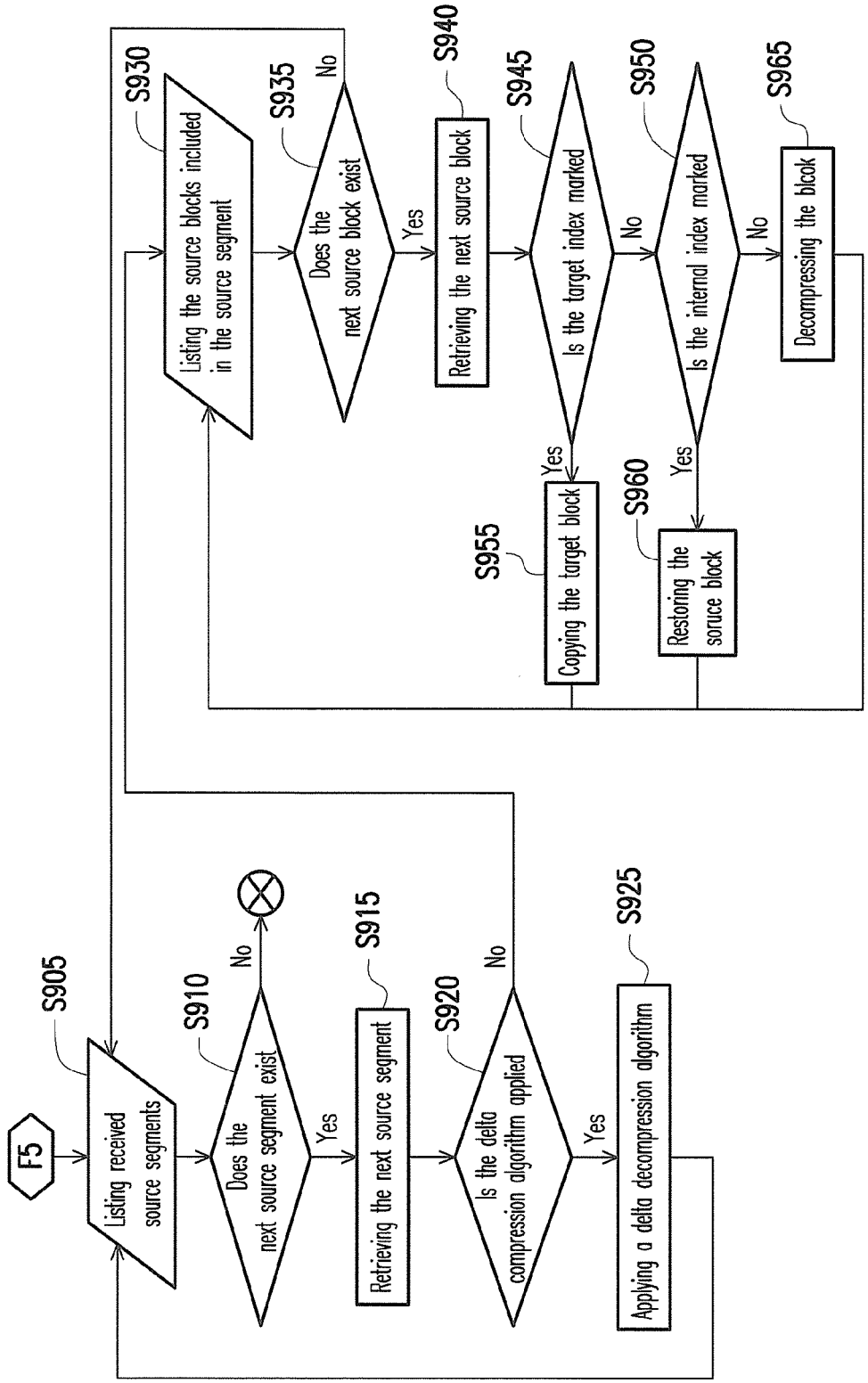
FIG. 9 is a flowchart illustrating a rehydration procedure according to an embodiment of the disclosure.

Subsequently, step S235 of FIG. 2 are described in detail as follows. FIG. 9 is a flowchart illustrating a rehydration procedure according to an embodiment of the disclosure. In step S905, the target apparatus B lists received source segments {SS1, SS2, SS3 . . . , SS#I}. Next, in step S910, the delta decompression processor 163 determines whether the next source segment exists. If yes, in step S915, the delta decompression processor 163 retrieves the next source segment. If no, it indicates that the rehydration procedure is applied for all of the source segments, and thus the rehydration procedure is ended.

Next, in step S920, the delta decompression processor 163 determines whether the delta compression algorithm is applied for this source segment. If the result of step S920 is yes, the procedure proceeds to step S925, in which the delta decompression processor 163 applies a delta decompression algorithm for this source segment. Thereafter, the procedure returns back to step S905, in which the next source segment is retrieved. If the result of step S920 is no, the procedure proceeds to step S930, in which the reconstruct processor 164 lists the source blocks included in the source segment. Further, in step S930, the source blocks included in this source segment are listed. In step S935, the reconstruct processor 164 determines whether the next source block exists. If yes, in step S940, the reconstruct processor 164 retrieves the next source block. If no, the procedure returns back to step S905, in which the next source segment is retrieved.

After the source block is retrieved, in step S945, the reconstruct processor 164 determines whether the target index is marked. If the result of step S945 is yes, in step S955, the reconstruct processor 164 copies the corresponding target block. Thereafter, the procedure returns back to step S930 for retrieving the next source block. If the result of step S945 is no, in step S950, the reconstruct processor 164 determines whether the internal index is marked. If the result of step S950 is yes, in step S960, the reconstruct processor 164 copies the corresponding source block. If the result of step S950 is no, in step S965, the decompression processor 165 decompresses this source block. Thereafter, the procedure returns back to step S930 for retrieving the next source block.

In addition, it should be noted that, in other embodiments, the source apparatus A may also transmit the similarity set and an ex-received similarity set to the target apparatus B according to the comparison result previously received from the target apparatus B. The ex-received similarity set includes the similarity value of the target segment recorded in the comparison result previously received from the target apparatus B. In the target apparatus B, when it is determined that the target segment corresponding to the source segment exists in the target apparatus B, if the similarity value of the target segment is included in the ex-received similarity set, the hash value of each of the target blocks included in the target segment of the target apparatus is not recorded into the comparison result currently intended to be transmitted to the source apparatus A.

For example, assuming that the comparison result previously received by the source apparatus A includes the similarity values SHT3, SHT5 and SHT8, when step S205 is applied, the similarity values SHT3, SHT5 and SHT8 of the target apparatus B are served as the ex-received similarity set, and the ex-received similarity set and the similarity set are transmitted together to the target apparatus B. After the received similarity values and the similarity set are received, the target apparatus B may be informed of all the hash values of the blocks included in the similarity values SHT3, SHT5 and SHT8 that already exist in the source apparatus A. Therefore, after step S215 is applied by the target apparatus B, if the comparison result being transmitted includes "{SHS1:{SHT5, SHT8},}" only the similarity values SHT5 and SHT8 are transmitted in the comparison result, and all the hash values of the blocks included in the similarity values SHT5 and SHT8 are not transmitted. Accordingly, transmission of the hash values of the blocks may be dehydrated to further reduce the data transmission quantity.

In summary, the source apparatus divides the original data into the segments and calculates the similarity set thereof, so as to transmit the similarity set of less data quantity to the target apparatus. After the comparison is made in the target apparatus, the comparison result including the similarity values and the hash values (which are also of less data quantity) are transmitted to the source apparatus. As such, the source apparatus may dehydrate the original data according to comparison result. By adopting a collaboration of the source apparatus and the target apparatus, the similarity set with less data quantity may be transmitted first, so that the source apparatus may perform the transmission after the repeated data is deleted. As a result, the data quantity of the data transmission on the network may be reduced and the data storage amount may also be saved.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A data transmission method, comprising:
   in a source apparatus, dividing original data into a plurality of source segments, performing a similarity calculation for each of the source segments to obtain a similarity set, and transmitting the similarity set to a target apparatus, wherein the similarity set comprises a similarity value of each of the source segments;
   in the target apparatus, determining whether a target segment corresponding to any one of the source segments exists in the target apparatus according to the similarity set to obtain a comparison result, and transmitting the comparison result to the source apparatus;
   in the source apparatus, after dehydrating the original data according to the comparison result to obtain dehydration data, transmitting the dehydration data to the target apparatus; and
   in the target apparatus, rehydrating the dehydration data to the original data,
   the step of dehydrating the original data according to the comparison result comprises:
   applying a delta compression algorithm for each of the source segments not having the corresponding target segment in the target apparatus according to the comparison result;
   applying a deduplication algorithm for a plurality of source blocks included in each of the source segments where the delta compression algorithm is not applied; and
   compressing the data where the delta compression algorithm and the deduplication algorithm are not applied, so as to obtain the dehydration data.

2. The data transmission method of claim 1, wherein the step of applying the delta compression algorithm comprises:
   sequentially retrieving one of the source segments to serve as a current segment, and determining whether the corresponding target segment is provided in the target apparatus according to the comparison result;
   if no, retrieving a plurality of previous segments in front of the current segment and comparing the previous segments with the current segment, so as to retrieve a $N^{th}$ source segment having a highest similarity degree with respect to the current segment from among the previous segments in order to apply the delta compression algorithm for the current segment and the $N^{th}$ source segment.

3. The data transmission method of claim 1, wherein in the target apparatus, the step of rehydrating the dehydration data to the original data comprises:
   decompressing the dehydration data;
   rehydrating the source block deleted by the deduplication algorithm in the dehydration data; and rehydrating the source segments dehydrated by the delta compression algorithm.

4. The data transmission method of claim 1, wherein in the target apparatus, the step of obtaining the comparison result comprises:

when determining that the target segment corresponding to any one of the source segments does not exist in the target apparatus, recording the similarity value of one of the source segments where the corresponding target segment does not exist and a corresponding null value into the comparison result;

when determining that the target segment corresponding to any one of the source segments exists in the target apparatus, recording the similarity value of one of the source segments where the corresponding target segment exists and a similarity value of the corresponding target segment into the comparison result; and retrieving a hash value of each of a plurality of target blocks included in the target segment corresponding to any one of the source segments, and recording the hash values into the comparison result.

5. The data transmission method of claim 4, further comprising:

in the source apparatus, transmitting the similarity set and an ex-received similarity set to the target apparatus, wherein the ex-received similarity set comprises the similarity value of the target segment recorded in the comparison result previously received from the target apparatus; and in the target apparatus, when the target segment corresponding to any one of the source segments exists in the target apparatus, if the similarity value of the target segment is included in the ex-received similarity set, not recording the hash value of each of the target blocks included in the target segment of the target apparatus into the comparison result currently intended to be transmitted to the source apparatus.

6. The data transmission method of claim 1, wherein the step of applying the deduplication algorithm comprises:

in the source segments where the delta compression algorithm is not applied, sequentially retrieving the source blocks included in one of the source segments;

determining whether a source block table in the source apparatus and the comparison result have the same hush value, and marking a target index on the same hash value when the same hash value is present; and determining whether the hash value of each of the source blocks is repeated according to the source block table, and marking an internal index on the repeated hash value.

7. The data transmission method of claim 6, wherein in the source apparatus, after the step of dividing the original data into the source segments, the data transmission method further comprises:

dividing each of the source segments into the source blocks; and performing a hash value calculation for each of the source blocks to obtain the hash value of each of the source blocks, and recording the hash values into the source block table.

8. A data transmission system, comprising:

a source apparatus, comprising a first communication unit and a first processing unit; and a target apparatus, comprising a second communication unit and a second processing unit, wherein the target apparatus and the source apparatus are communicated through the second communication unit and the first communication unit;

wherein the first processing unit divides original data into a plurality of source segments, performs a similarity calculation for each of the source segments to obtain a similarity set, and transmits the similarity set to the target apparatus, wherein the similarity set comprises a similarity value of each of the source segments;

after the similarity set is received by the target apparatus from the source apparatus, the second processing unit determines whether a target segment corresponding to any one of the source segments exists in the target apparatus according to the similarity set to obtain a comparison result, and transmits the comparison result to the source apparatus;

after the comparison result is received by the source apparatus from the target apparatus, the first processing unit dehydrates the original data according to the comparison result to obtain dehydration data, and transmits the dehydration data to the target apparatus; and after the dehydration data is received by the target apparatus from the source apparatus, the second processing unit rehydrates the dehydration data to the original data, wherein the first processing unit further comprises:

a delta compression processor, applying a delta compression algorithm for each of the source segments not having the corresponding target segment in the target apparatus according to the comparison result;

a duplication processor, applying a deduplication algorithm for a plurality of source blocks included in each of the source segments where the delta compression algorithm is not applied; and a compression processor, compressing the data where the delta compression algorithm and the deduplication algorithm are not applied, so as to obtain the dehydration data.

9. The data transmission system of claim 8, wherein after the comparison result is obtained by the target apparatus, the second data processor applies following operations including:

when determining that the target segment corresponding to any one of the source segments does not exist in the target apparatus, recording the similarity value of one of the source segments where the corresponding target segment does not exist and a corresponding null value into the comparison result;

when determining that the target segment corresponding to any one of the source segments exists in the target apparatus, recording the similarity value of one of the source segments where the corresponding target segment exists and a similarity value of the corresponding target segment into the comparison result; and retrieving a hash value of each of a plurality of target blocks included in the target segment corresponding to any one of the source segments, and recording the hash values into the comparison result.

10. The data transmission system of claim 8, wherein the second processing unit further comprises:

a decompression processor, decompressing the dehydration data;

a reconstruct processor, rehydrating the source block deleted by the deduplication algorithm in the dehydration data; and a delta decompression processor, rehydrating the source segments dehydrated by the delta compression algorithm.

11. The data transmission system of claim 8, wherein the source apparatus further comprises:
a first memory unit, coupled to the first processing unit and storing a source segment table; and
a first storage unit, coupled to the first processing unit and storing the original data and a source block table;
wherein the first processing unit further comprises:
a first data processor, dividing the original data into the source segments and dividing each of the source segments into a plurality of source blocks; and
a first hash calculation processor, performing the similarity calculation for each of the source segments to record the similarity value of each of the source segments into the source segment table, and performing the hash value calculation for each of the source blocks to record a hash value of each of the source blocks into the source block table;
the target apparatus further comprises:
a second memory unit, coupled to the second processing unit and storing a target segment table; and
a second storage unit, coupled to the second processing unit and storing a target block table;
the second processing unit comprises:
a second data processor, determining whether the target segment corresponding to any one of the source segments exists in the target apparatus according to the similarity set, dividing replication data into the target segments, and dividing each of the target segments into a plurality of target blocks; and
a second hash calculation processor, performing the similarity calculation for each of the target segments to record a similarity value of each of the target segments into the target segment table, and performing a hash value calculation for each of the target blocks to record a hash value of each of the target blocks into the target block table.

12. The data transmission system of claim 11, wherein
in the source apparatus, the first data processor transmits the similarity set and an ex-received similarity set to the target apparatus, wherein the ex-received similarity set comprises the similarity value of the target segment recorded in the comparison result previously received from the target apparatus;
in the target apparatus, when the target segment corresponding to any one of the source segments exists in the target apparatus, if the similarity value of the target segment is included in the ex-received similarity set, the second data processor does not record the hash value of each of the target blocks included in the target segment of the target apparatus into the comparison result currently intended to be transmitted to the source apparatus.

* * * * *